United States Patent
Schuster et al.

(10) Patent No.: US 8,688,191 B2
(45) Date of Patent: Apr. 1, 2014

(54) COMBINED TOMOGRAPHY SCANNER

(75) Inventors: Johann Schuster, Oberasbach (DE);
Stefan Stocker, Großenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 1802 days.

(21) Appl. No.: 12/071,645

(22) Filed: Feb. 25, 2008

(65) Prior Publication Data
US 2008/0208032 A1    Aug. 28, 2008

(30) Foreign Application Priority Data
Feb. 26, 2007  (DE) .......................... 10 2007 009 180

(51) Int. Cl.
*A61B 5/055*  (2006.01)
(52) U.S. Cl.
USPC .......................................... 600/407; 600/411
(58) Field of Classification Search
None
See application file for complete search history.

(56) References Cited

U.S. PATENT DOCUMENTS

| | | | |
|---|---|---|---|
| 4,411,616 A * | 10/1983 | Neumann | 431/114 |
| 5,235,283 A | 8/1993 | Lehne et al. | |
| 6,111,412 A | 8/2000 | Boemmel et al. | |
| 6,642,717 B2 | 11/2003 | Dietz et al. | |
| 7,121,098 B2 * | 10/2006 | Hatcher | 62/5 |
| 7,218,112 B2 * | 5/2007 | Ladebeck et al. | 324/318 |
| 2004/0216468 A1 * | 11/2004 | Hatcher | 62/5 |
| 2005/0070779 A1 * | 3/2005 | Singh et al. | 600/407 |
| 2006/0241386 A1 * | 10/2006 | Yanagita et al. | 600/415 |
| 2006/0251312 A1 * | 11/2006 | Krieg et al. | 382/131 |
| 2007/0080296 A1 * | 4/2007 | Ueno et al. | 250/363.04 |
| 2008/0265887 A1 * | 10/2008 | Linz et al. | 324/318 |
| 2008/0281238 A1 * | 11/2008 | Oohashi et al. | 601/46 |
| 2008/0284428 A1 * | 11/2008 | Fiedler et al. | 324/307 |

FOREIGN PATENT DOCUMENTS

| | | |
|---|---|---|
| DE | 4141514 A1 | 8/1992 |
| DE | 19721985 A1 | 12/1998 |
| DE | 10032836 C1 | 1/2002 |

OTHER PUBLICATIONS

Markus Schwaiger et al.; "MR-PET: Combining Function, Anatomy, and More" Medical Solutions/Special Molecular Imaging, Siemens AG, Sep. 2005,; Others.
Carstens J., "PET Einschub für Kernspintomograph", IN; ip.com, Apr. 16, 2005; Others; and English translation thereof.
German Office Action dated May 14, 2008.

* cited by examiner

*Primary Examiner* — Long V. Le
*Assistant Examiner* — Lawrence Laryea
(74) *Attorney, Agent, or Firm* — Harness, Dickey & Pierce, P.L.C.

(57) ABSTRACT

A combined tomography scanner is disclosed, having at least two imaging modalities. In at least one embodiment, the scanner includes a first tomography modality having an essentially annular or tubular measurement area opening formed by an inner perimeter; an annular or cylindrical PET component as a second tomography modality having an outer perimeter, which allows insertion into the measurement area opening, and having an inner opening which forms a patient tunnel; and at least one insulation mat which can be inserted into an annular gap between the inner perimeter of the first modality and the outer perimeter of the PET component.

20 Claims, 2 Drawing Sheets

COMBINED TOMOGRAPHY SCANNER

PRIORITY STATEMENT

The present application hereby claims priority under 35 U.S.C. §119 on German patent application number DE 10 2007 009 180.1 filed Feb. 26, 2007, the entire contents of which is hereby incorporated herein by reference.

FIELD

Embodiments of the present invention generally relate to an imaging device. In one example embodiment, the present invention relates to an integrated measuring device having a magnetic resonance scanner and a positron emission tomograph.

BACKGROUND

Magnetic resonance scanners (MRI) use the physical principle that atomic nuclei in magnetic fields experience a precession movement of the nuclear spin of these atomic nuclei which can be measured and whose characteristic depends on the type of atomic nucleus. Magnetic resonance imaging uses this phenomenon for imaging by magnets, which are usually arranged in the form of a tube or annulus around a patient couch, inducing reactions of the atomic nuclei within the body of the patient, in which case these reactions can be detected by way of detectors and evaluated. Processing of the acquired data results in three dimensional images of the examined body; the images depend on the location within the body and the type of tissue.

Gradient coils (GC) which additionally modulate the applied magnetic field are used in MRIs. These GCs are usually arranged concentrically to a permanent-magnet field ring and generate temporary magnetic fields, developing noise and vibrations in the process. Furthermore, body coils (BC), a specific type of measurement receiver, are also often present and are also arranged concentrically to the other coils. This thus results in a concentric configuration of an MRI comprising a plurality of layers. The configuration of an MRI is known to a person skilled in the art.

Positron emission tomographs (PET) use a different physical principle for imaging inside the patient's body. In this case, a radiopharmaceutical is introduced into the body and can be stored in the most diverse organs and tissues of the body, depending on its respective metabolism. In the decay processes of the respective radionuclide (inter alia, PET uses $^{18}$F, $^{11}$C, $^{13}$N or $^{15}$O which emit positrons as they decay) used in the radiopharmaceutical, positrons are emitted which collide with electrons while they are still in the patient's body and are thus annihilated, releasing gamma radiation as secondary radiation in the form of two photons in the process. These photons move apart from each other at an angle of approximately 180°. This secondary radiation can be measured by suitable receivers. These receivers also surround the patient's body in the form of a tube or annulus, similar to the MRI. Generally, PET images lack anatomical information due to the display of metabolic processes or the information is very limited and restricted by the limited spatial resolution (approximately 4-5 mm). For a while, different manufacturers (inter alia General Electric) have been offering appliances, which combine a PET scanner with a computed tomography scanner (CT) as two "modalities". Such a combination of PETs with MRI appliances is also planned for the near future.

This raises the question of the spatial arrangement of these two modalities. It is possible to arrange the two gantries in series and move the patient through the two detectors, one after the other. However, such an arrangement allows only time delayed acquisition of those body parts and is thus undesirable. For simultaneous operation of both modalities, closer spatial coupling of both modalities is required. One possible system component arrangement is to fit the PET detectors effectively within the other appliance, that is to say within the MRI for example, for instance between the GC and BC. However, such installation is complicated. A separate PET tube or PET ring offers great advantages with respect to maintainability and production. However, the main difficulties with such an approach are:

- Only very limited space is available for attaching the tube, moreover "radial installation space" is very expensive in MRIs.
- There is little space for a heat shield within the PET component; however, said heat shield is required due to the adjacently arranged GC, whose surface temperature can reach up to 80° C.
- The proximity of the PET component to the oscillating GC leads to vibrational coupling between the two via airborne sound and/or structure-borne sound; this not only causes a noise problem, but can also lead to a reduced service life of the PET component and impairment of its operation.
- There is thermal coupling to the GC, which can moreover be subject to surface temperature fluctuations. The PET electronics react sensitively to both temperature fluctuations and excessive temperature increases. Temperature fluctuations result in the deterioration of the signal and in noise.

SUMMARY

The inventors, in at least one embodiment, have discovered that it would therefore be desirable to find an approach for close spatial arrangement between both modalities without having to accept thermal or vibrational impairment of the PET measurement by the other modality, such as an MRI or CT.

At least one embodiment of the invention is based on the principle of fixing a PET component, which can be inserted into the tube or ring of the outer modality (for example, a CT or an MRI), with an insulation mat between both components.

Correspondingly, at least one embodiment of the invention relates to a combined tomography scanner having at least two imaging modalities, with a first tomography modality having an essentially annular or tubular measurement area opening formed by an inner perimeter; an annular or cylindrical PET component being the second tomography modality having an outer perimeter, which allows insertion into the measurement area opening, and having an inner opening which forms a patient tunnel; and having at least one insulation mat which can be inserted into an annular gap between the inner perimeter of the first modality and the outer perimeter of the PET component.

In one example embodiment, the first modality is a magnetic resonance scanner (MRI) or a computed tomography scanner (CT); the use of an MRI seeming more appropriate on account of the physical properties.

The term "insulation" in the insulation mat simultaneously refers to different types of insulation, in particular spatial isolation (separation), thermal insulation, acoustic insulation and vibrational insulation. It is self-evident that not all insulating functions have to be present in all embodiments of the invention at the same time.

The insulation mat preferably forms a complete ring or cylinder between inner perimeter and outer perimeter. It can be composed of a plurality of segments or a single piece (even if composed of a plurality of components).

In one example embodiment, the insulation mat provides essentially complete spatial fixing for the PET component in the measurement area opening. This fixes the PET component in its allotted position in the combined tomography scanner without further fastenings, in particular screw connections or holders made from metal, etc.

In one example embodiment, the insulation mat is intended for vibrational insulation.

Additionally, the insulation mat is preferably intended as an alternative to or addition to thermal insulation.

The volume of the insulation mat can be variable; this both modifies its insulating properties and also allows its removal from the device, and simple insertion and removal of the PET component, which is fixed by the insulation mat.

The volume can preferably be varied by inflating the insulation mat with a fluid. The fluid can be a liquid, for example a cooling liquid pumped into the mat, and/or a gas, for example compressed air or cooling air.

In one particularly example embodiment of the invention, the fluid is compressed air, which for example particularly fixes the PET components or presses them against specific areas of the mat.

The insulation mat may have a plurality of cells with a variable volume, which are distributed over the insulation mat. These vary in volume of the mat and can, for instance, be inflated with the abovementioned compressed air.

Furthermore, the insulation mat may have areas through which a coolant can flow. This can be any typically used coolant, including cold gases and specific liquids, or else simply water.

Furthermore, the insulation mat preferably has areas with vibration-isolating properties. These areas with vibration-isolating properties include, for example, vibration-damping materials which are inserted into the insulation mat.

The vibration-damping materials can be caoutchouc products and/or silicone rubbers.

The areas having vibration-isolating properties are preferably arranged in the lower half of the annular gap, to additionally use or compensate for gravitation acting on the PET component.

In one example embodiment, the variable-volume chambers, which can press the PET component onto the areas with vibration-isolating properties when their volume increases, are arranged in the upper area of the annular gap.

Furthermore, the insulation mat can comprise two sheets which are fused together, between which other elements can be arranged. This allows simple and economic production of the insulation mat from low-cost components.

In one example embodiment, the coefficient of friction of the surface of the insulation mat allows insertion into the annular gap.

BRIEF DESCRIPTION OF THE DRAWINGS

The invention is described below on the basis of one specific example embodiment, reference being made to the attached drawings, in which.

DETAILED DESCRIPTION OF THE EXAMPLE EMBODIMENTS

Figure 1:
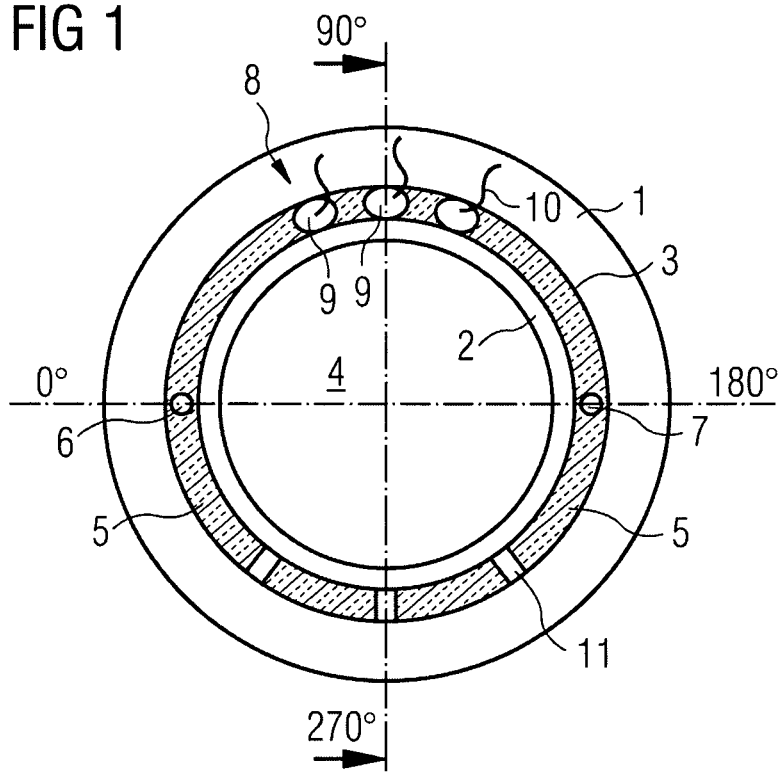
FIG. 1 shows a cross section through one embodiment of the inventive device, that is to say in the direction of the patient tunnel.

The terminology used herein is for the purpose of describing particular embodiments only and is not intended to be limiting of the present invention. As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described. Like numbers refer to like elements throughout. As used herein, the terms "and/or" and "at least one of" include any and all combinations of one or more of the associated listed items.

An embodiment of the invention places an essentially cylindrical PET detector inside the tube or the ring of a further modality such as an MRI and fixes/insulates the PET detector by way of an insulation mat.

The PET tube is preferably arranged within the GC tube. The annular gap between both components required for tolerance compensation and play for installation is used both for a vibration-decoupled fixing and for the thermal decoupling between the two components. This function therefore does not require the provision of additional radial space in the components.

In this case, an insulation mat or a plurality of partial segments of an insulation mat, which is for example inserted into the remaining annular gap between the MR tube and the PET tube after the positioning of the PET component, implements all the required functions.

The insulation mat is welded together in suitable form, for example from two polyurethane sheets or similar materials, so that zones with channels having coolant flowing though them; zones to which compressed air can be applied; and zones for the vibrational decoupled fixing of the PET component are formed on the inner perimeter of the MRI tunnel.

One example of such a design is shown in FIG. 1. This shows, in a cross section in the direction of the patient tunnel, the layered structure of a device according to one exemplary embodiment one the invention in. An outer ring 1 schematically shows a first modality, for example an MRI ring. A PET component 2, which is also annular, is inserted into this MRI ring and is fixed and insulated from the outer ring by means of an insulation mat 3. There is enough space within the PET component for a patient tunnel 4.

The shaded zones 5 of the insulation mat 3 represent a system of channels, which is supplied with fluid from the line 6 and where the line 7 removes the fluid again after it has flowed through the system of channels. These zones 5 including channels with coolant flowing through them serve as a heat shield against the temperature fluctuations on the surface of the generator coil.

Furthermore, at least one zone 8 is provided, whose volume can be varied. This is effected by means of pressurized-air channels 9, which can be inflated via compressed air lines 10. This zone or these zones 8, which can be expanded using air pressure, result in transmission of force over an area between the two tubes 1 and 2, even when the cooling is switched off. It is most advantageous for these zones to be arranged in the area of the side of or on the top of the annular gap, in order to exert a downward pressure to press the PET tube 2 against the generator coil 1 via incorporated rubber plates 11, or similar, having a high coefficient of friction to prevent a displacement of the PET component 2. Furthermore, the advantage of this arrangement is that in the case of the channels 9 not being filled with air and the cooling (which also contributes to the volumetric expansion of the insulation mat) being switched off, the height of the cushioning and of the insulation is considerably reduced and thus allowing the insulation mat to be inserted into the device. It may be necessary to lift the PET tube 2 above the concentric centre of the inventive device, in particular of the patient tunnel 4, during the insertion of the insulation mat 3, in order to be able to insert the rubber mats 11. Once these have been moved into position, the PET tube 2 can be lowered.

The zones with the incorporated vibration-isolating materials 11 for vibration-damped positioning of the PET tube 2 in the GC 1 are preferably arranged in the lower area (around 270°). The weight of the PET tube 2 then prevents its displacement, even without additional pressure cushioning. Caoutchouc products or silicone rubbers are suitable materials for welding into the insulation mat. Since the coefficient of friction of the material of the mat should be low to ease insertion, and the coefficient of friction of the vibration-damping materials should be high to prevent a displacement of the components, the insulation mat can be segmented, so that the materials come into direct contact with the tube surfaces.

Figure 2:
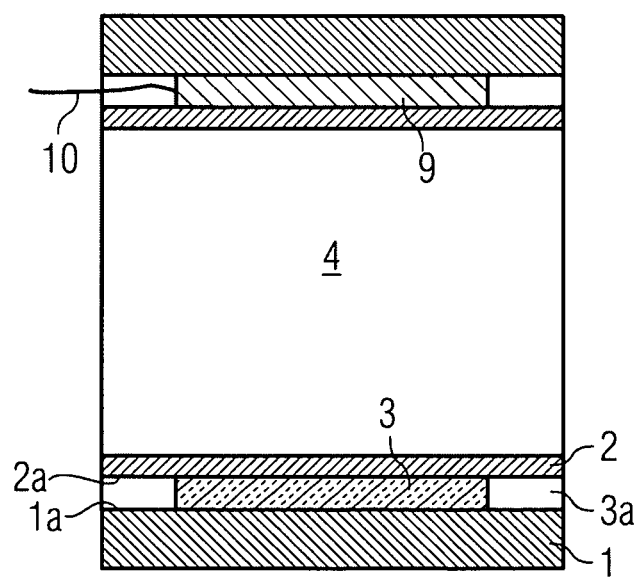
FIG. 2 shows a longitudinal section through the device shown in FIG. 1.

FIG. 2 shows a longitudinal section through the embodiment from FIG. 1. In this case, the same elements are referred to by the same reference symbols. Additionally, the figure shows that the insulation mat 3 does not have to fill the entire annular gap 3a in the longitudinal direction, provided sufficient insulation and fixing of the PET tube 2 in the device are ensured. The inner perimeter 1a of the first modality 1 and the outer perimeter of the PET component 2a are also shown.

Figure 3:
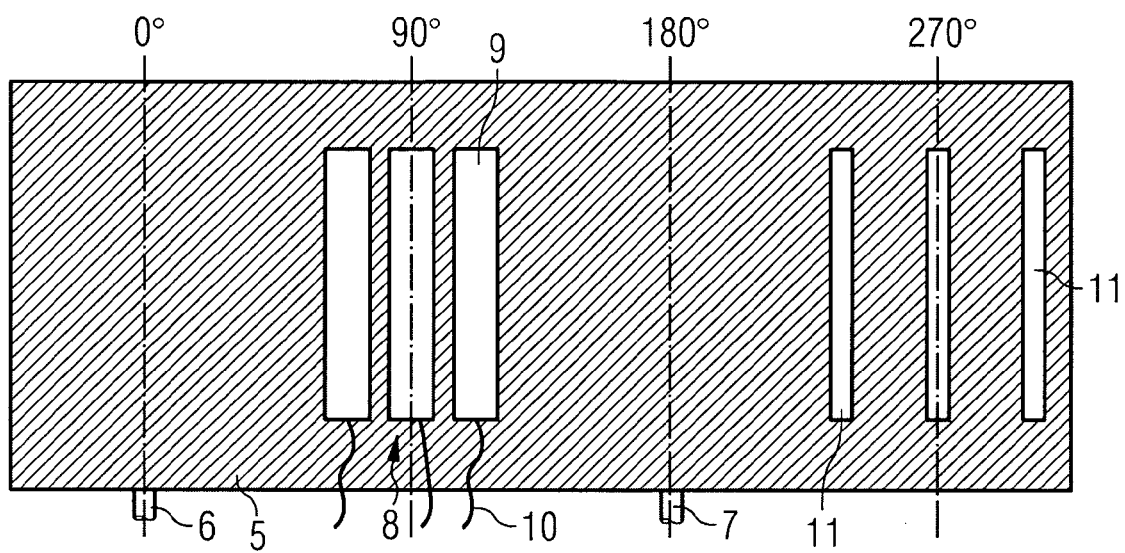
FIG. 3 shows a developed view of the insulation mat used in the embodiment.

FIG. 3 shows a developed view of the insulation mat according to the described exemplary embodiment of the invention. The angular references correspond to those in FIG. 1, to ease association of the individual mat components.

At least one embodiment of the present invention allows the integration of various functions in a fixture assembly (insulation mat) which uses the annular gap required anyhow in the chosen configuration, without requiring additional expensive installation space within the components.

The device can be fitted and removed quickly and easily by activation of the pressure zones and inserting or removing the insulation mat. The production of the insulation mat can be implemented cost-effectively and is an easily replaceable component during servicing. However, the fixing effected is robust.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program and computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a computer readable media and is adapted to perform any one of the aforementioned methods when run on a computer device (a device including a processor). Thus, the storage medium or computer readable medium, is adapted to store information and is adapted to interact with a data processing facility or computer device to perform the method of any of the above mentioned embodiments.

The storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A combined tomography scanner having at least two imaging modalities comprising:

a first tomography modality including at least one of an essentially annular and an essentially tubular measurement area opening formed by an inner perimeter;

at least one of an annular and a cylindrical positron emission tomograph (PET) component as a second tomography modality, including an outer perimeter to allow insertion into the measurement area opening, and including an inner opening forming a patient tunnel; and at least one insulation mat, insertable into an annular gap between the inner perimeter of the first modality and the outer perimeter of the PET component, wherein a volume of the insulation mat is variable.

2. The tomograph as claimed in claim 1, wherein the first modality is a magnetic resonance scanner.

3. The tomograph as claimed in claim 2, wherein the insulation mat forms at least one of a complete ring and a complete cylinder between the inner perimeter and outer perimeter.

4. The tomograph as claimed in claim 1, wherein the first modality is a computed tomograph.

5. The tomograph as claimed in claim 4, wherein the insulation mat forms at least one of a complete ring and a complete cylinder between the inner perimeter and outer perimeter.

6. The tomograph as claimed in claim 1, wherein the insulation mat forms at least one of a complete ring and a complete cylinder between the inner perimeter and outer perimeter.

7. The tomograph as claimed in claim 1, wherein the insulation mat provides essentially complete spatial fixing of the PET component in the measurement area opening.

8. The tomograph as claimed in claim 1, wherein the insulation mat provides vibration insulation.

9. The tomograph as claimed in claim 1, wherein the insulation mat provides thermal insulation.

10. The tomograph as claimed in claim 1, wherein the volume is variable by using a fluid to inflate the insulation mat.

11. The tomograph as claimed in claim 10, wherein the fluid is compressed air.

12. The tomograph as claimed in claim 1, wherein the insulation mat includes a plurality of variable-volume chambers, distributed over the insulation mat.

13. The tomograph as claimed in claim 1, wherein the insulation mat includes areas permitting coolant flow.

14. The tomograph as claimed in claim 1, wherein the insulation mat includes areas having vibration-isolating properties.

15. The tomograph as claimed in claim 14, wherein the areas having vibration-isolating properties include vibration-damping materials inserted into the insulation mat.

16. The tomograph as claimed in claim 15, wherein the vibration-damping materials are at least one of caoutchouc products and silicone rubbers.

17. The tomograph as claimed in claim 14, wherein the areas including vibration-isolating properties arranged in the lower half of the annular gap.

18. The tomograph as claimed in claim 14, wherein variable-volume chambers, which can press the PET component onto the areas having vibration-isolating properties when a volume of the volume chambers increases, are arranged in an upper area of the annular gap.

19. The tomograph as claimed in claim 1, wherein the insulation mat includes two sheets fused together.

20. The tomograph as claimed in claim 1, wherein a coefficient of friction of a surface of the insulation mat allows insertion into the annular gap.

* * * * *